United States Patent [19]

Raffel et al.

[11] Patent Number: 4,810,663
[45] Date of Patent: Mar. 7, 1989

[54] METHOD OF FORMING CONDUCTIVE PATH BY LOW POWER LASER PULSE

[75] Inventors: Jack I. Raffel; John A. Yasaitis, both of Lexington; Glenn H. Chapman, Bedford; Mark L. Naiman, Lincoln; James A. Burns, Harvard, all of Mass.

[73] Assignee: Massachusetts Institute of Technology, Cambridge, Mass.

[21] Appl. No.: 260,096

[22] Filed: May 6, 1986

Related U.S. Application Data

[63] Continuation-in-part of Ser. No. 657,127, Oct. 3, 1984, abandoned, which is a continuation of Ser. No. 328,356, Dec. 7, 1981, abandoned.

[51] Int. Cl.$^4$ ............................................. H01L 21/265
[52] U.S. Cl. ........................................ 437/19; 357/91; 437/46; 437/171
[58] Field of Search .......................... 437/19, 46, 171; 357/91

[56] References Cited

U.S. PATENT DOCUMENTS

| | | | |
|---|---|---|---|
| 3,771,026 | 11/1973 | Asai et al. | 317/234 R |
| 4,023,005 | 5/1977 | Bolin | 219/121 LM |
| 4,151,545 | 4/1979 | Schnepf et al. | 357/71 |
| 4,168,444 | 9/1979 | van Santen | 357/30 |
| 4,177,474 | 12/1979 | Ovshinsky | 357/2 |
| 4,190,855 | 2/1980 | Inoue | 357/80 |
| 4,259,367 | 3/1981 | Dougherty, Jr. | 437/19 |
| 4,270,137 | 5/1981 | Coe | 357/59 |
| 4,270,960 | 6/1981 | Bollen et al. | 357/59 |
| 4,272,775 | 6/1981 | Compton et al. | 357/29 |
| 4,275,410 | 6/1981 | Grinberg et al. | 357/68 |
| 4,289,834 | 9/1981 | Alcorn et al. | 428/601 |
| 4,318,752 | 3/1982 | Tien | 437/19 |
| 4,335,362 | 6/1982 | Salathe et al. | 372/46 |
| 4,372,989 | 2/1983 | Menzel | 427/53.1 |
| 4,387,503 | 6/1983 | Aswell et al. | 357/86 |
| 4,398,343 | 8/1983 | Yamazaki | 427/86 |
| 4,413,272 | 11/1983 | Mochizuki et al. | 357/65 |
| 4,437,109 | 3/1984 | Anthony et al. | 357/65 |
| 4,438,450 | 3/1984 | Sheng et al. | 357/68 |
| 4,446,613 | 5/1984 | Beinglass et al. | 357/59 |
| 4,456,490 | 6/1984 | Duttal et al. | 427/53.1 |
| 4,462,150 | 7/1984 | Nishimura et al. | 427/53 |
| 4,467,312 | 8/1984 | Komatsu | 427/82 |
| 4,479,829 | 10/1984 | Kniekamp | 437/19 |
| 4,565,712 | 1/1986 | Noguchi et al. | 437/19 |
| 4,581,620 | 4/1986 | Yamazaki et al. | 148/DIG. 93 |

FOREIGN PATENT DOCUMENTS

| | | | |
|---|---|---|---|
| 1010156 | 5/1977 | Canada | 357/715 |
| 0135865 | 5/1977 | Japan | |
| 53-26689 | 3/1978 | Japan | |
| 0085122 | 2/1979 | Japan | |

OTHER PUBLICATIONS

Aggarwal, B. K., IBM-TDB, 21 (1979) 3271.
Drowley et al., A Comparison of CW Laser and Electron-Beam Recrystallization of Polysilicon in Multilayer Structures, Laser-Solid Interactions and Transient Thermal Processing of Materials, Ed (J. Narayan et al.), North-Holland, N.Y., 1982, p. 529.
O. Minato, et al., "A High-Speed Hi-CMOSII 4K Static RAM", pp. 449–453, IEEE Journal of Solid-State Circuits, vol. SC-16, No. 5, Oct. 1981.
J. M. Harris et al., "Solid-Phase Crystallization of S Films in Contact with Al Layers", pp. 2897–2904, Journal of Applied Physics, vol. 48, No. 7, Jul., 1977.
M. Hongo, et al., THD2 "Connecting Conductors on Semiconductor Devices by Lasers", Hitachi, Ltd. 4/15/82.

(List continued on next page.)

*Primary Examiner*—Upendra Roy
*Attorney, Agent, or Firm*—Wolf, Greenfield & Sacks

[57] ABSTRACT

An integrated circuit device including a link point for electrically connecting a plurality of metal layers, comprising a first metal layer, a link insulating layer and a second metal layer. Diffusion barrier may be employed between the link insulator layer and each of the first metal layer and the second metal layer. The metal layers are connected by exposing the link point to a low-power laser for a relatively long pulse width.

3 Claims, 4 Drawing Sheets

OTHER PUBLICATIONS

J. G. Posa, "Redundancy-What to do When the Bits go Out", 7/28/81, pp. 117-120, Electronics.

G. H. Chapman et al., "A Laser Linking Process for Restructurable VLSI*", MIT, CLEO '82, 4/14-16/82, Phoenix, Ariz.

J. F. Smith et al., "Laser Induced Personalization & Alterations of LSI & VLSI Circuits", IBM Corporation.

E. E. Conrad, "Aluminum-Copper-Silicon Semiconductor Metallurgy", IBM Technical Disclosure Bulletin, vol. 13 (1971), p. 3661.

J. Leff, "Aluminum-Silicon Conductor Formation", IBM Technical Disclosure Bulletin, vol. 12 (1970), p. 1996.

Raffel et al. in International Electron Device Meeting, Dec. 1980, p. 132.

4,810,663

METHOD OF FORMING CONDUCTIVE PATH BY LOW POWER LASER PULSE

The Government has rights in this invention pursuant to Contract No. F9618-80-C-0002 awarded by the Department of the Air Force.

This application is a continuation-in-part of U.S. Ser. No. 657,127 filed Oct. 3,, 1984 now abandoned which is a continuation of Ser. No. 328,356 filed Dec. 7, 1981 now abandoned.

BACKGROUND OF THE INVENTION

This invention relates to novel interconnect wiring arrangements on a silicon wafer and to methods for producing the same. Mort particularly, the present invention relates to methods for interconnecting a plurality of metal layers on a silicon wafer after transistors and wiring have been patterned and fabricated.

Prior to the present invention, metal layers each positioned on a different vertical height, separated by an insulating layer and positioned on a silicon wafer had been connected by means of relatively high power lasers such as dye lasers utilizing one or more pulses, each a few nanoseconds wide. The laser power is sufficiently high as to effect opening of the top metal layer, usually alumimum, removal of the intermediate silicon-containing layer by microexplosions and migration of metal into the opening through the insulating layer thickness to effect electrical contact between the metal layers. Typically, the laser power utilized is several kilowatts and the width of each pulse is between about 2 and 6 nanoseconds. The major problem with this prior technique for forming interconnections is that the high-powered laser causes microexplosions which, in turn, cause splatter of metal to occur. This results in poor control in forming electrically conductive paths in the desired pattern. In addition, this technique is generally unsuitable for cutting established conductive paths because of this metal splattering which many times creates new undesirable conductive paths. It would be highly desirable to provide a means for interconnecting different metal layers positioned on a silicon wafer in a manner which provides relatively uniform conduction paths without the formation of new undesirable conductive paths. In addition, it would be desirable to provide such means which also is useful for cutting established conductive paths without creating new undesirable conductive paths.

SUMMARY OF THE INVENTION

The present invention provides an integrated circuit device which includes a plurality of metal layers with a link insulator layer interposed between the metal layers. The composition of the link insulator is capable of alloying with the metal in the metal layers to form a conductive path between the metal layers. A link point comprising the two metal layers and the link insulator layer can be set apart from a first main conductive path formed of the first metal and a second main conductive path formed of the second metal so that the metal layers in the link point can be interconnected or one or more of the metal layers in the link point can be electrically disconnected from the main conductive paths. Alternatively, the metal layers of the link point can each comprise the first main conductive path of the second main conductive. Interconnection of the metal layers in the link point is achieved by exposing the link point to a low power laser having a pulse in the order of about 1 millisecond. When utilizing these laser conditions, low resistivity connections can be achieved without damage to the base oxide, thereby avoiding exposure to the substrate.

DESCRIPTION OF SPECIFIC EMBODIMENT

Figure 1:
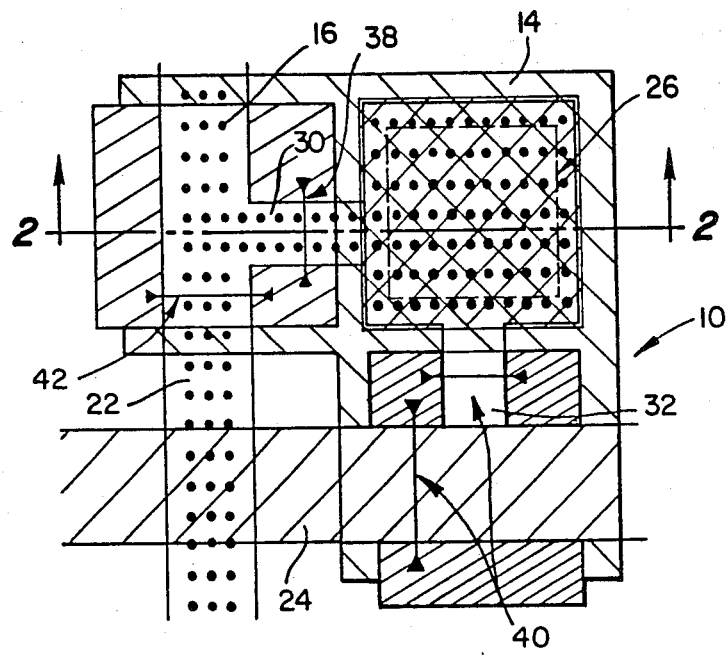
FIG. 1 is a top view of a section of an integrated circuit device of this invention with the link point set apart from the main conductive paths.
Figure 2:
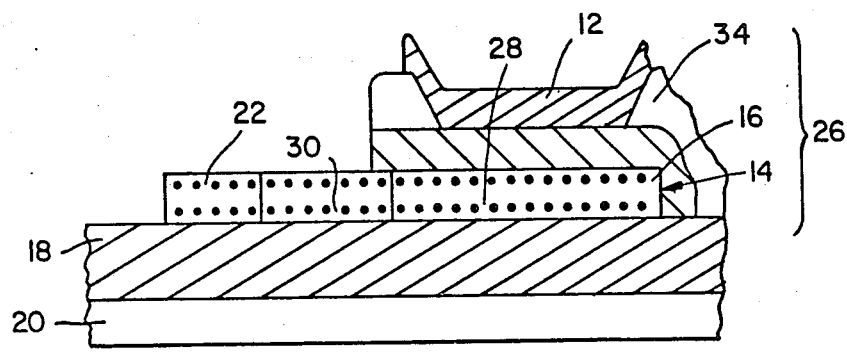
FIG. 2 is a cross-sectional view of FIG. 1 taken along line 2—2.
Figure 3:
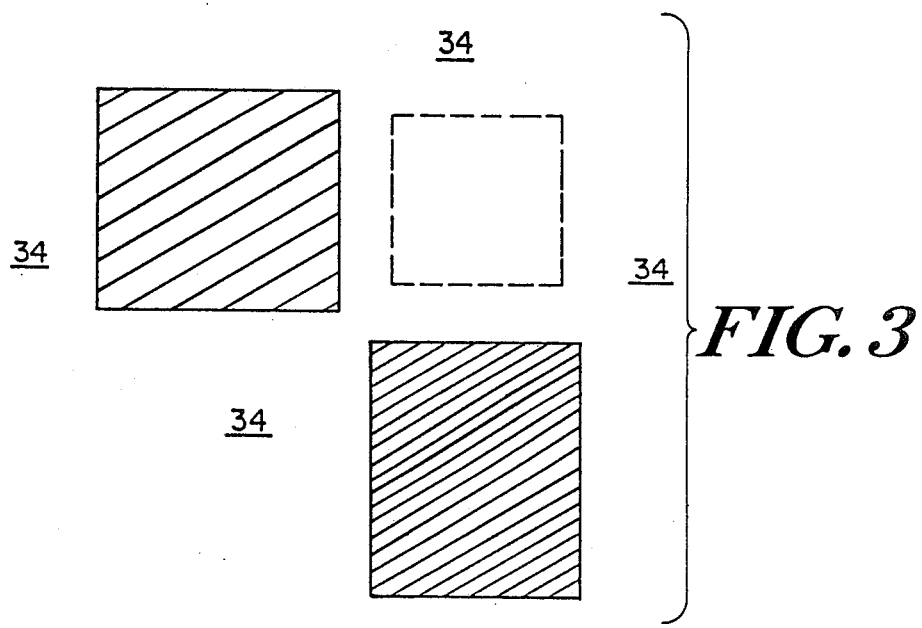
FIG. 3 is a top view of the surface of the device of FIG. 1 lacking polyimide.
Figure 4:
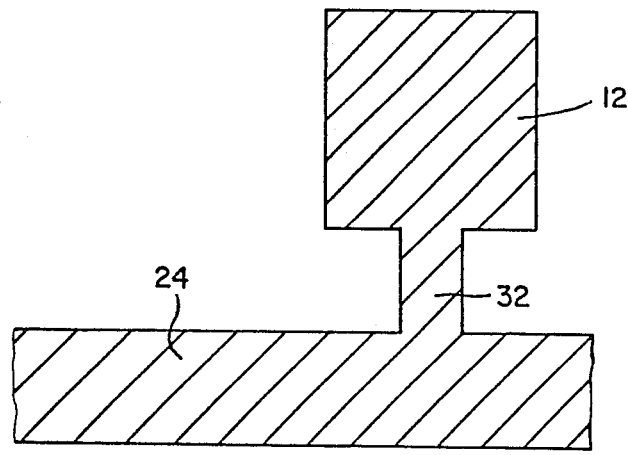
FIG. 4 is a top view of the second metal layer of the device of FIG. 1.

Referring to FIGS. 1 through 4, the integrated circuit device 10 of this invention comprises a second metal layer 12, a link insulator layer 14 and a first metal layer 16 which is supported on a base oxide 18 and a substrate 20. The first metal layer 16 is configured so that it includes a first main conductive path 22. The second metal layer 12 includes a second main conductive path 24. The first main conductive path 22 and the second main conductive path 24 provide means for electrically connecting the integrated circuit device of this invention to other electrical components into which the device is incorporated by any conventional means. A link point 26 is comprised of a sandwich of the second metal 12, the link insulator 14 and the first metal 16. The link point 26 is set apart from the second main conductive path 24 so that electrical connection between the second metal layers 12 and the first metal layer 16 can be effective without interrupting the main conductive paths 22 and 24. In addition, the first metal section 28 which forms part of the link point 26 is electrically connected to the first main conductive path 22 by means of bridge 30 formed of the first metal. Similarly, the second metal 12 which forms a part of the link point 26 is electrically connected to the second main conductive path 24 by means of bridge 32 formed of the second metal. The polyimide layer 34 can be formed on all sections of the integrated circuit device with the exception of the link point so that, at the link point, the first metal 16 directly contacts the link insulator material 14.

The first metal layer 16 and the second metal layer 12 can be formed of any electrically conducting metal or alloy capable of interacting with the link insulator layer to form an electrically conductive path including aluminum. Si-Al-Cu alloys or the like metals capable of forming silicides or the like may be formed from insulating materials capable of being doped by mixing or alloying with the first metal 16 and the second metal 12 to form an electrically conductive path through the thickness of the link insulator layer 14. Suitable llnk insulator layers include amorphous germanium, amorphous silicon, undoped polysilicon, polycrystalline germanium or the like. Of these materials, amorphous silicon is preferred. A barrier layer is interposed between the link insulator layer 14 and each of the metal layers 12 and 16 in order to prevent diffusion of metal into the link insulator.

Suitable diffusion barriers include silicon dioxide, silicon nitride, refractory nitrides such as tungsten nitride, titanium nitride or the like. Typical thicknesses for the diffusion barrier layer is between $0.1\mu$ and $1\mu$ which permits formation of the electrical path between the first and second metals and provides the diffusion barrier. It is preferred that the first and second metals comprise aluminum or its alloys.

Silicon nitride is also a suitable link insulator layer. With silicon nitride the barrier layers are not required to prevent migration of alluminum during high temperature processing. Silicon nitride has been used to provide vertical isolation between two overlapping metal lines. Thus the same material, thick silicon nitride, may be used for intermetal insulation and in the link itself, thus simplifying manufacture. If amorphous silicon is used, it is used only at the link points. A further advantage is the fact that silicon nitride has a considerably smaller dielectric constant than that of amorphous silicon. This smaller dielectric constant results in a smaller leakage capacitance and thus faster circuits. Since silicon nitride is an insulator, while silicon is a semiconductor, silicon nitride links have a considerably higher resistance when in the off (unconnected) state.

The electrically conductive path through the link insulator layer 14 is formed by means of a low-power laser opening in the $0.2\mu$ to $1\mu$ range, such as an argon laser or the like, laser operating at a power between about 1 and about 3 watts, preferably between about 1 and about 1.5 watts for a light beam about 3 microns in diameter. For light beams having a smaller diameter, lower power lasers can be utilized to obtain equivalent power densities. The link point is exposed to the laser for a period of time of between about 0.01 and about 10 milliseconds, preferably about 0.1 and about 1 milliseconds.

In forming the link point, the exposed first metal surface 16 of the link point 26 is exposed to the laser to permit alloying through the link insulator layer 14, thereby connecting the first and second metals. Depending on the power level employed, the alloying may be achieved with a depression which may appear at first observation to look like a hole with alloy surfaces, or there may be little or no depression at the alloyed region. It is believed that the alloying is achieved through turbulence in the laserheated region. In order to achieve this desired electrical path, without disturbing the base oxide 18, the thickness of the link insulator material should be between about $0.2\mu$ and about $2\mu$, preferably between about 0.5 and about $1\mu$, while the first and second metal layers should have a thickness of between about $0.3\mu$ and about $2\mu$, preferably between about $0.5\mu$ and about $1\mu$. The base oxide typically comprises silicon dioxide, and can have a thickness between about $0.4\mu$ and about $2\mu$. The substrate can comprise crystalline silicon, GaAs, or silicon on insulator. Electrical connection to the link point 26 from the main conductive paths 22 and 24 through bridges 30 and/or 32 can be cut by exposing the bridges 30 or 32 to a laser under the same condition set forth above for forming the link point. The bridges 30 and/or 32 can be cut by the laser at cut points 36 and 38. In addition, the main conductive paths 22 and 24 can be cut with a laser under these same conditions at cut points 40 and 42 when desired. Only one metal layer 12 or 16 is positioned at cut points 36, 38, 40 and 42. If more than one metal layer were present at the cut points 36, 38, 40, and 42, the undesirable possibility of electrically connecting the metal layers would be present.

Figure 5:
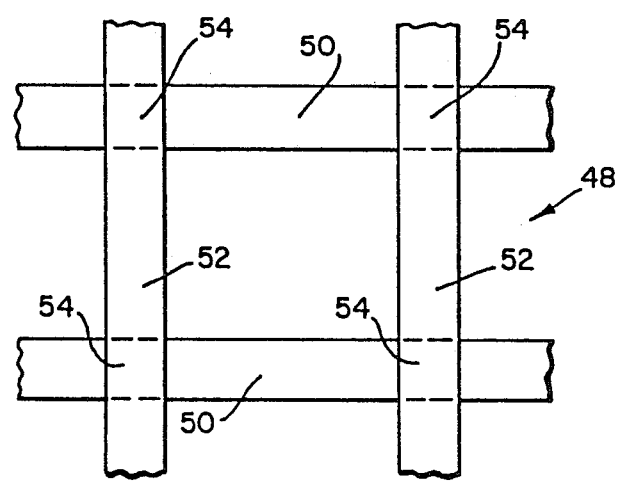
FIG. 5 is a top view of an integrated circuit device with the link point corresponding to the main conductive paths.
Figure 6:
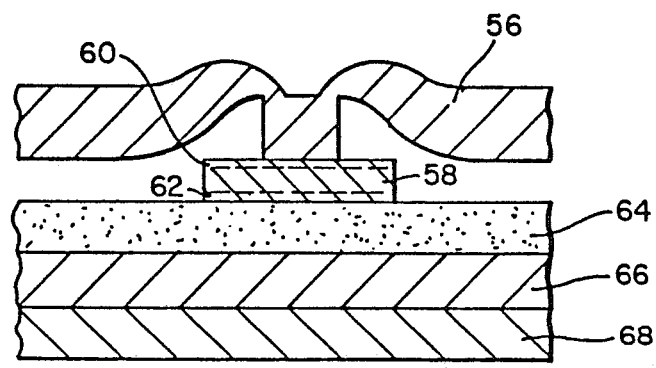
FIG. 6 is a cross-sectional view taken along line 8—8 of FIG. 5.

Referring to FIGS. 5 and 6, the integrated circuit device 48 includes first main conductive paths 50 and second main conductive paths 52 and link points 54. Each link point 54 includes the second metal layer 56, the insulator layer 58, the barrier diffusion layers 60 and 62, the first metal layer 64, the base oxide 66 and the substrate 68.

The alloy, e.g., Al, Si, Cu is deposited by sputter typically to a thickness of amount 0.5 $\mu$m. The wafer then is annealed at about 450° C. for about 10 minutes in forming gas. The metal surface then is spin cleaned in isopropyl alcohol. Silicon dioxide (10 nm ±2 nm) then is deposited by chemical vapor deposition at 425° C. The wafer then is spun cleaned in isopropyl alcohol. Amorphous silicon of 0.7 $\mu$m then is deposited by sputter deposition. The amorphous silicon surface then is spin cleaned in isopropul alcohol. Silicon dioxide, e.g., 10 nm ±2 nm then is deposited by chemical vapor deposition at 425° C. The wafer then is spin cleaned in isopropyl alcohol and about 0.7 $\mu$m of an Al, Si, Cu alloy is deposited by sputter deposition.

What is claimed is:

1. The process for forming an electrically conductive path between a first metal layer and a second metal layer of a link point of an integrated circuit device where the device includes a substrate, a layer of base oxide on said substrate, the first metal layer on at least a portion of said base oxide having at least one first main conductive path, at least one first link point portion, and at least one bridge portion extending between said first main conductive path and said link portion, the second metal layer including a second link point portion that overlies said first link point portion in a spaced relationship and at least one second main conductive path and at least one bridge portion extending between said second main conductive path and said second link point, comprising forming a layer of a link insulator material of silicon nitride that overlies said first metal layer at least at said first link portion and extends vertically to said second link portion, exposing the second metal layer of said link point to a laser pulse between about 1 and about 3 watts for a time period between about 0.01 and about 10 milliseconds, thereby to effect the formation of an alloyed region between the first metal, said second metal and the link insulator material.

2. The process of claim 1 wherein said time period is between about 0.1 and about 1 millisecond.

3. The process of claim 1 wherein said laser pulse is between about 1 and 1.5 watts

* * * * *